United States Patent [19]

Wagner et al.

[11] 4,245,187

[45] Jan. 13, 1981

[54] VLF CAPACITOR CORONA DETECTION

[75] Inventors: Neal K. Wagner, Pine Valley; Neil M. Davis, San Diego, both of Calif.

[73] Assignee: The United States of America as represented by the Secretary of the Navy, Washington, D.C.

[21] Appl. No.: 37,795

[22] Filed: May 10, 1979

[51] Int. Cl.³ ............................................. G01R 31/12
[52] U.S. Cl. ........................................ 324/54; 324/52; 324/72
[58] Field of Search ..................... 324/54, 72, 52, 126, 324/133

[56] References Cited

U.S. PATENT DOCUMENTS

| | | | |
|---|---|---|---|
| 3,622,872 | 11/1971 | Boaz | 324/54 |
| 3,657,602 | 4/1972 | Boehm et al. | 324/54 |
| 3,707,673 | 12/1972 | Carter | 324/54 |
| 3,739,272 | 6/1973 | McKean | 324/54 |
| 3,869,665 | 3/1975 | Kenmochi et al. | 324/54 |
| 4,064,454 | 12/1977 | Yoshino et al. | 324/54 |
| 4,140,965 | 2/1979 | Neal | 324/54 |

*Primary Examiner*—David K. Moore

*Attorney, Agent, or Firm*—Richard S. Sciascia; Ervin F. Johnston; Thomas M. Phillips

[57] ABSTRACT

A method and apparatus for determining the presence of partial discharge activity (corona) which makes use of corona current signals in the 20 MHz to 50 MHz frequency range and provides for identification of the corona source in a capacitor matrix. A current probe coupled to the high potential side of the capacitor detects corona discharge current signals that are fed to a bandpass filter which passes signals in the frequency range of 20 MHz to 50 MHz. The signals from the bandpass filter are amplified and integrated to provide a d.c. level proportional to the corona activity. The d.c. level signal is encoded by a voltage controlled oscillator and then converted to light. A fiber optic link transmits the converted signal to a remote console where the encoded light is reconverted to a d.c. level signal which can be displayed as an analog signal as well as activating an audio or visual alarm. A plurality of local current sensors and related circuitry corresponding to the number of capacitors in the capacitor matrix are provided to provide for comparisons of the corona signal levels from each capacitor to provide identification of the source capacitor containing the highest corona activity.

5 Claims, 2 Drawing Figures

VLF CAPACITOR CORONA DETECTION

BACKGROUND OF THE INVENTION

Impairment or interruption of VLF communication links has occurred due to the failure of large high-power capacitors. Field experience has indicated that intense corona activity in entrapped gases within the oil dielectric precedes catastrophic dielectric breakdown and failure of the capacitor. At present, the presence of corona discharge within each capacitor is detected indirectly and with slow response times by measuring the temperature of the oil dielectric (to detect increases in temperature of the oil mass resulting from localized heating due to corona) and by monitoring the gas pressure above the oil (to determine pressure increase due to the evolution of gases resulting from corona activity).

A corona or partial discharge has been defined by the American Society for Testing and Materials as "a type of localized discharge resulting from transient gaseous ionization in an insulation system when the voltage stress exceeds a critical value. The ionization is localized over only a portion of the distance between the electrodes of the system." In the specific case of an oil-filled capacitor having polypropylene insulators and oil between parallel electrodes, partial discharge can occur in entrapped or evolved gases which displace the oil. It is important to note that the ionized gases which make up the corona are highly conductive and would result in a direct arc discharge between electrodes unless prevented from forming a complete path, as in the case with polypropylene insulating barrier.

All of the effects due to the presence of a corona discharge within the oil are not completely understood. It is known, however, that the conductive nature of the corona represents a significant perturbation in the local electric field between the electrodes somewhat analogous to the existence of a structural asperity at the metal electrode. According to the conduction and breakdown model of Thomas and Foster such an asperity results in several effects including field enhanced charge injection into the insulating fluid. In addition, free electrons in the gas can be accelerated by the electric field to velocities sufficient to cause dissociation of oil molecules forming the periphery of the gas volume. This effect, coupled with the chemical reactivity of the gas plasma, results in the evolution of additional gases, the formation of polymeric species, and the subsequent introduction into the insulating oil of particulate matter.

Heating of the surrounding materials by the corona discharge produces density gradients in the oil consequently affecting the electroviscous and electrohydrodynamic nature of the movement of the oil in an applied electric field.

All of these effects of the presence of the corona discharge within the oil dielectric, when considered in total with other effects such as the field-induced absorption of charge carriers into the polymeric insulators and the variation of oil parameters with contamination and use, present an exceedingly complex situation with multiple competitive paths leading to catastrophic breakdown of the capacitor. Nonetheless, the contributory nature of corona discharge to potential failure of a capacitor is clear and therefore the inception of corona activities should be avoided.

One known method of the detection of corona is the detection of corona-induced RF-voltages, a method which is available commercially and is in widespread use. A disadvantage of this method of VLF capacitor applications is that significant interference exists in the frequency range (typically to a few hundred kHz) normally measured by these instruments due to harmonics of the VLF fundamental and noise. Additionally, since several capacitors appear in parallel, it would be difficult to determine the location of the specific corona source resulting in RF-voltage pulses.

SUMMARY OF THE INVENTION

The present invention provides for specific corona detection in VLF oil-field capacitors by detection of the RF currents resulting from corona discharges. A local sensor assembly is provided for detecting high frequency current pulses generated by partial discharge activity within each of the capacitors of a capacitor matrix. The sensed pulses are converted to light and transmitted by fiber optic means to a remote console for reconversion to electrical signals and for comparison to determine the level of partial discharge in each capacitor.

Each local sensor array comprises a current probe for detecting the pulses. The detected pulses are fed to a bandpass filter for passing pulses in the 20 MHz to 50 MHz range. The signal from the bandpass filter is integrated and converted to light signals for transmission over an optical link to a remote console.

Accordingly, an object of the invention is for the detection of corona activity that is dependent on the presence of high frequency corona discharge currents in the range of 20 MHz to 50 MHz without interference from noise, VLF harmonics, or other spurious signals.

Another object of the invention is the provision of a detection means for detecting corona discharge in VLF oil-filled capacitors when connected in a matrix by detecting the corona activity in each capacitor and comparing the results to determine the severity of the corona discharge in each capacitor.

Another object of the invention is a provision for an automatic alarm system for signaling corona activity in a VLF oil-filled capacitor when the corona activity reaches a predetermined level.

Other objects and many of the attendant advantages of this invention will be readily appreciated as the same becomes better understood by reference to the following detailed description when considered in connection with the accompanying drawings.

DETAILED DESCRIPTION

Figure 1:
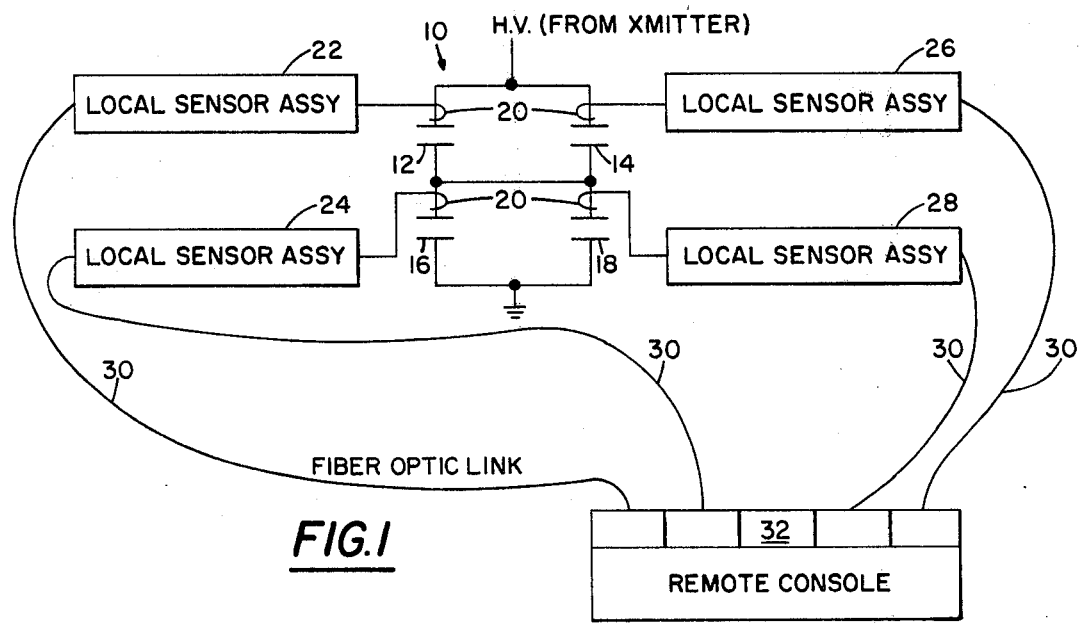
FIG. 1 is a block diagram of the overall configuration of the invention.

Referring now to FIG. 1 wherein there is shown a matrix of capacitors 10 including capacitors 12, 14, 16, and 18 connected as typically used in coupling a VLF transmitter to an antenna. A current probe 20 is coupled to the high-side of each of the capacitors 12, 14, 16, and 18. Each current probe 20 is coupled respectively to a local sensor assembly 22, 24, 26, or 28. The output signal from each local sensor assembly is fed through a fiber optic link 30 to a remote console 32.

Figure 2:
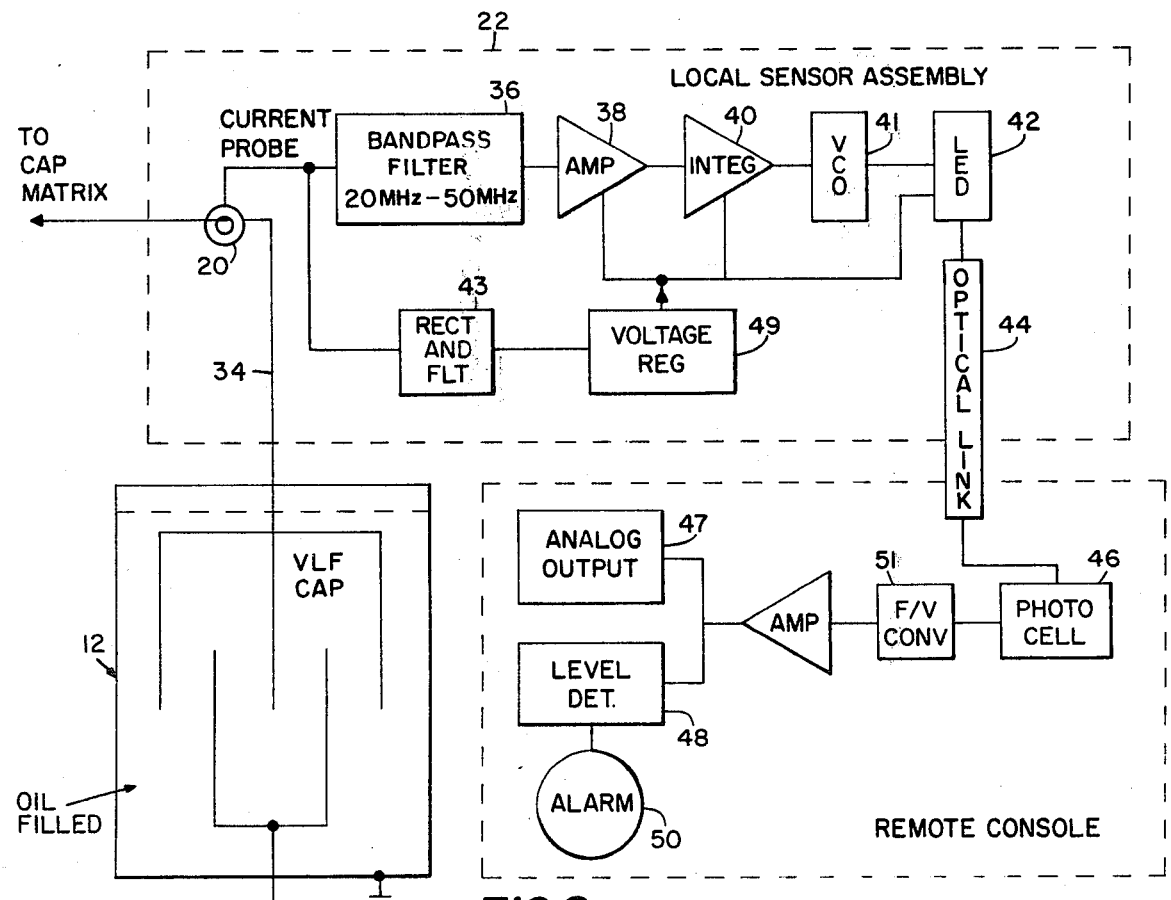
FIG. 2 is a block diagram showing the local sensor assembly of one unit and the block diagram of the remote console.

Referring now to FIG. 2, there is shown in detail and by way of example, one of the local sensor assemblies of FIG. 1. Probe 20 is coupled to conductor 34 which is connected to the high-side of oil-filled capacitor 12. The detected high frequency current signal is fed to bandpass filter 36 which allows only the higher frequency signals in the 20 MHz to 50 MHz passband to be fed to amplifier 38. The output signal from amplifier 38 is integrated to form a d.c. signal proportional to the extent of corona activity. The d.c. signal is connected as the control voltage of a voltage-oscillator 41. The output of oscillator 41 is then a frequency modulated signal. The frequency modulated signal is fed to an electro-optical converter which in practice may be a light emitting diode 42. The light signal is then transmitted through optical link 44 to opto-electronic converter or photocell 46 located at a remote console. The frequency modulated electrical signal out of converter 46 is fed to a frequency to voltage converter 51. The output of converter 51 is amplified and fed to an analog indicator 47 and to a level detector 48 for operating an alarm 50 when the signal reaches a selected level.

In operation, high frequency current pulses generated by partial discharge (corona) activity within capacitor 12 are detected by current probe 20 situated on the high (non-case) side of the capacitor 12. Current probe 20 may be Rogowski spiral or Stoddart/Singer current transform type 93686-2, both of which discriminate against low frequencies. Current detector 20 must be located on the high (potential) portion of the capacitor in order to avoid the case-to-ground losses for high frequency currents.

Bandpass filter 36 allows principally only the 20 MHz to 50 MHz corona current pulses to pass to the amplifier 28 after which they are integrated in integrator 40 to form a d.c. voltage level proportional to the extent of corona activity. The d.c. voltage level is encoded by voltage-controlled oscillator 41 and then converted to a light signal. The fiber-optic link provides high voltage isolation and the encoding protects the light signal from the light intensity sensitivity.

At the remote console 32, the encoded light signal is reconverted to a d.c. voltage level in converter 46 and frequency to voltage converter 51, the output of which may be displayed as an analog signal or sensed by level detector 48 to trigger an audio or visual alarm 50. The local current sensor and related circuitry 22 must be repeated for each capacitor as shown in FIG. 1. The detected signals from each of the sensors are displayed by remote console allowing immediate and continuous monitoring of corona levels. Comparison of the corona signal levels from each capacitor allows identification of the source capacitor containing the highest corona activity.

Power for each local sensor is derived by the rectification of the VLF signal by means of the rectifier and filter 43. This ensures that the detector circuit will always function whenever the transmitter is operating and VLF is present. The output of rectifier filter 43 is fed through a voltage regulator 49 to various sensor components.

Obviously, many other modifications and variations of the present invention are possible in the light of the above teachings. It is therefore to be understood that within the scope of the appended claims the invention may be practiced otherwise than as specifically described.

What is claimed is:

1. Apparatus for detecting corona discharge in an electrical apparatus containing a matrix of capacitors disposed in a fluid, comprising, for each capacitor:

means coupled to the capacitor electrode having the relatively higher potential for detecting high-frequency current pulses therethrough in the range of 20 MHz to 50 MHz generated by partial discharge activity within said electrical apparatus;

integrating circuit means coupled to said detecting means and responsive to said high frequency current pulses for providing an output signal proportional to the level of said partial discharge activity;

isolating means coupled to said integrating circuit means for electrically isolating said detecting means and said integrating means and for transmitting said output signals; and remote indicating means coupled to said isolating means for indicating the level of said partial discharge activity.

2. The apparatus of claim 1 further comprising a bandpass filter coupled between said detecting means and said integrating means having a bandpass of 20 MHz to 50 MHz.

3. The apparatus of claim 2 wherein said detecting means is a current probe.

4. The apparatus of claim 3 wherein said isolating means is a fiber optic transmission link.

5. The apparatus of claim 4 wherein said remote indicating means is a remote console and has means for receiving sensed partial discharge activity from more than one capacitor, whereby the output signals received from all capacitors are compared to identify the capacitor having the highest discharge ctivity.

* * * * *